United States Patent
Lee et al.

(10) Patent No.: US 10,333,107 B2
(45) Date of Patent: Jun. 25, 2019

(54) ELECTROLUMINESCENT DISPLAY DEVICE

(71) Applicant: LG Display Co., Ltd., Seoul (KR)

(72) Inventors: Hak-Min Lee, Yongin-si (KR); Hee-Jin Kim, Yongin-si (KR); Sung-Soo Park, Gwacheon-si (KR)

(73) Assignee: LG Display Co., Ltd., Seoul (KR)

( * ) Notice: Subject to any disclaimer, the term of this patent is extended or adjusted under 35 U.S.C. 154(b) by 1 day.

(21) Appl. No.: 15/847,725

(22) Filed: Dec. 19, 2017

(65) Prior Publication Data

US 2018/0190941 A1 Jul. 5, 2018

(30) Foreign Application Priority Data

Dec. 29, 2016 (KR) .......................... 10-2016-0182586

(51) Int. Cl.
*H01L 27/32* (2006.01)
*H01L 51/50* (2006.01)
*H01L 51/52* (2006.01)

(52) U.S. Cl.
CPC ...... *H01L 51/5275* (2013.01); *H01L 51/5004* (2013.01); *H01L 27/3244* (2013.01); *H01L 51/5268* (2013.01); *H01L 2251/5369* (2013.01); *H01L 2251/558* (2013.01)

(58) Field of Classification Search
CPC ............. H01L 51/5275; H01L 51/5004; H01L 27/3244; H01L 2251/558; H01L 51/5268; H01L 2251/5369
USPC .......................................................... 257/98
See application file for complete search history.

(56) References Cited

U.S. PATENT DOCUMENTS

| 4,774,435 A | 9/1988 | Levinson |
| 6,525,466 B1 | 2/2003 | Jabbour et al. |
| 2003/0193054 A1* | 10/2003 | Hayakawa .......... H01L 27/1248 257/72 |
| 2008/0254319 A1* | 10/2008 | Hosokawa ............. C07C 15/38 428/704 |

(Continued)

FOREIGN PATENT DOCUMENTS

| CN | 1535086 A | 10/2004 |
| CN | 1747612 A | 3/2006 |

(Continued)

OTHER PUBLICATIONS

"Lithium Fluoride Insulating Layer Improves Organic Light-Emitting Diodes," *Laser Focus World* 34(1), 1998, URL= laserfocusworld.com/articles/print/volume-34-issue-l/world-news/worldnewsbreaks, download date Dec. 18, 2017.

(Continued)

*Primary Examiner* — Patricia D Reddington
(74) *Attorney, Agent, or Firm* — Seed IP Law Group LLP

(57) ABSTRACT

An electroluminescent display device includes a substrate; a first electrode on the substrate; a hole auxiliary layer on the first electrode; a light emitting material layer on the hole auxiliary layer; an electron auxiliary layer on the light emitting material layer; a second electrode on the electron auxiliary layer; and insulation layers between the hole auxiliary layer and the light emitting material layer and between the electron auxiliary layer and the light emitting material layer, wherein a refractive index of the insulation layers is smaller than a refractive index of the light emitting material layer.

22 Claims, 6 Drawing Sheets

(56) References Cited

U.S. PATENT DOCUMENTS

| | | | | |
|---|---|---|---|---|
| 2014/0021450 A1* | 1/2014 | Young | ................... | B82Y 20/00 |
| | | | | 257/40 |
| 2014/0209886 A1* | 7/2014 | Ishidai | ................ | C07D 401/14 |
| | | | | 257/40 |
| 2015/0008422 A1* | 1/2015 | Lee | .................... | H01L 51/5268 |
| | | | | 257/40 |

FOREIGN PATENT DOCUMENTS

| | | |
|---|---|---|
| CN | 102956839 A | 3/2013 |
| CN | 103620807 A | 3/2014 |
| CN | 105304683 A | 2/2016 |

OTHER PUBLICATIONS

E. Clar, *Polycyclic Hydrocarbons*, Springer-Verlag, Berlin Heidelberg, Germany, 1964, Chapter 14, "The Electrical Conductivity of Aromatic Hydrocarbons," 1 page.

Hu et al., "Improving the performance of the organic thin-film transistors with thin insulating lithium fluoride buffer layer," *Microelectronics Journal* 38:632-636, 2007.

Park et al., "The influence of thin insulating lithium fluoride inserted pentacene layer on pentacene-based organic thin-film transistor," *Thin Solid Films* 495:385-388, 2006.

\* cited by examiner

ELECTROLUMINESCENT DISPLAY DEVICE

CROSS-REFERENCE TO RELATED APPLICATION

The present application claims priority from and the benefit under 35 U.S.C. § 119(a) of Korean Patent Application No. 10-2016-0182586, filed Dec. 29, 2016, which is hereby incorporated by reference in its entirety.

BACKGROUND

Technical Field

The present disclosure relates to an electroluminescent display device, and more particularly, to an electroluminescent display device having wide color gamut.

Description of the Related Art

Recently, flat panel displays have been widely developed and applied to various fields because of their thin profile, light weight, and low power consumption.

Among the flat panel displays, electroluminescent display devices emit light due to the radiative recombination of an exciton after forming the exciton from an electron and a hole by injecting charges into a light emitting layer between a cathode for injecting electrons and an anode for injecting holes.

The electroluminescent display devices include a flexible substrate such as plastic; because they are self-luminous, the electroluminescent display devices have excellent contrast ratios; the electroluminescent display devices have a response time of several micro seconds, and there are advantages in displaying moving images; the electroluminescent display devices have wide viewing angles and are stable under low temperatures; since the electroluminescent display devices are driven by a low voltage of direct current (DC) 5V to 15V, it is easy to design and manufacture driving circuits; and the manufacturing processes of the electroluminescent display device are simple since only deposition and encapsulation steps are required.

An electroluminescent display device includes a plurality of pixels to express various colors, and each pixel includes red, green and blue sub-pixels. Red, green and blue light emitting diodes are formed in the red, green and blue sub-pixels, respectively.

The red, green and blue light emitting diodes include red, green and blue light emitting materials, respectively, and the red, green and blue light-emitting materials have different properties from each other. Accordingly, it is difficult to obtain the red, green and blue light emitting materials that satisfy the required color coordinates and have uniform lifetimes and efficiencies. There is a problem that the related art electroluminescent display device has narrow color gamut.

BRIEF SUMMARY

Accordingly, the present disclosure is directed to an electroluminescent display device that substantially obviates one or more of the problems due to limitations and disadvantages of the related art.

An object of the present disclosure is to provide an electroluminescent display device capable of improving color gamut.

Additional features and advantages of the present disclosure will be set forth in the description which follows, and in part will be apparent from the description, or may be learned by practice of the present disclosure. The objectives and other advantages of the present disclosure will be realized and attained by the structure particularly pointed out in the written description and claims hereof as well as the appended drawings.

To achieve these and other advantages and in accordance with the purpose of the present disclosure, as embodied and broadly described herein, there is provided electroluminescent display device includes a substrate; a first electrode on the substrate; a hole auxiliary layer on the first electrode; a light emitting material layer on the hole auxiliary layer; an electron auxiliary layer on the light emitting material layer; a second electrode on the electron auxiliary layer; and insulation layers between the hole auxiliary layer and the light emitting material layer and between the electron auxiliary layer and the light emitting material layer, wherein a refractive index of the insulation layers is smaller than a refractive index of the light emitting material layer. In this case the insulation referred to is electrical insulation.

It is to be understood that both the foregoing general description and the following detailed description are by example and explanatory and are intended to provide further explanation of the present disclosure as claimed.

BRIEF DESCRIPTION OF THE SEVERAL VIEWS OF THE DRAWINGS

The accompanying drawings, which are included to provide a further understanding of the present disclosure and which are incorporated in and constitute a part of this specification, illustrate embodiments of the present disclosure and together with the description serve to explain the principles of the present disclosure. In the drawings.

DETAILED DESCRIPTION

Reference will now be made in detail to one or more embodiments of the disclosure, examples of which are illustrated in the accompanying drawings.

Figure 1:
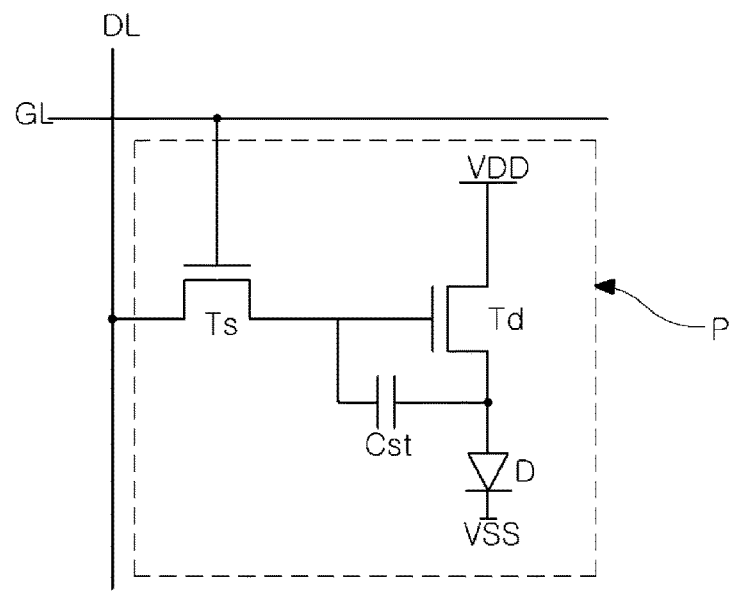
FIG. 1 is one example of a circuit diagram of one pixel region of an electroluminescent display device according to an embodiment of the present disclosure

FIG. 1 is a circuit diagram of one pixel region of an electroluminescent display device according to an embodiment of the present disclosure.

In FIG. 1, the electroluminescent display device according to the embodiment of the present disclosure includes a gate line GL, a data line DL, a switching thin film transistor Ts, a driving thin film transistor Td, a storage capacitor Cst and a light emitting diode D. The gate line GL and the data line DL cross each other to define a pixel region P. The switching thin film transistor Ts, the driving thin film transistor Td, the storage capacitor Cst and the light emitting diode D are formed in the pixel region P.

More particularly, a gate electrode of the switching thin film transistor Ts is connected to the gate line GL and a drain (or source) electrode of the switching thin film transistor Ts is connected to the data line DL. A gate electrode of the driving thin film transistor Td is connected to a source (or drain) electrode of the switching thin film transistor Ts, and a drain (or source) electrode of the driving thin film transistor Td is connected to a high voltage supply VDD. In an MOS transistor, the terminals that act as the source and drain may switch places at various times, depending on the voltage levels applied to the various nodes, include the body, therefore the terms source and drain as used herein should be considered interchangeable. Further, the term source/drain may also be used to refer to either terminal. An anode of the light emitting diode D is connected to a source/drain electrode of the driving thin film transistor Td, and a cathode of the light emitting diode D is connected to a low voltage supply VSS. The storage capacitor Cst is connected to the gate electrode and the source/drain electrode of the driving thin film transistor Td.

The electroluminescent display device is driven to display an image. For example, when the switching thin film transistor Ts is turned on by a gate signal applied through the gate line GL, a data signal from the data line DL is applied to the gate electrode of the driving thin film transistor Td and an electrode of the storage capacitor Cst through the switching thin film transistor Ts. When the driving thin film transistor Td is turned on by the data signal, an electric current flowing through the light emitting diode D is controlled, thereby displaying an image. The light emitting diode D emits light due to the current supplied through the driving thin film transistor Td from the high voltage supply VDD.

Namely, the amount of the current flowing through the light emitting diode D is proportional to the magnitude of the data signal, and the intensity of light emitted by the light emitting diode D is proportional to the amount of the current flowing through the light emitting diode D. Thus, the pixel regions P show different gray levels depending on the magnitude of the data signal, and as a result, the electroluminescent display device displays an image.

In addition, the storage capacitor Cst maintains charges corresponding to the data signal for a frame when the switching thin film transistor Ts is turned off. Accordingly, even if the switching thin film transistor Ts is turned off, the storage capacitor Cst allows the amount of the current flowing through the light emitting diode D to be constant and the gray level shown by the light emitting diode D to be maintained until a next frame.

Meanwhile, in the pixel region P, one ore more transistors and/or capacitors may be added in addition to the switching thin film transistor Ts, the driving thin film transistor Td and the storage capacitor Cst.

Figure 2:
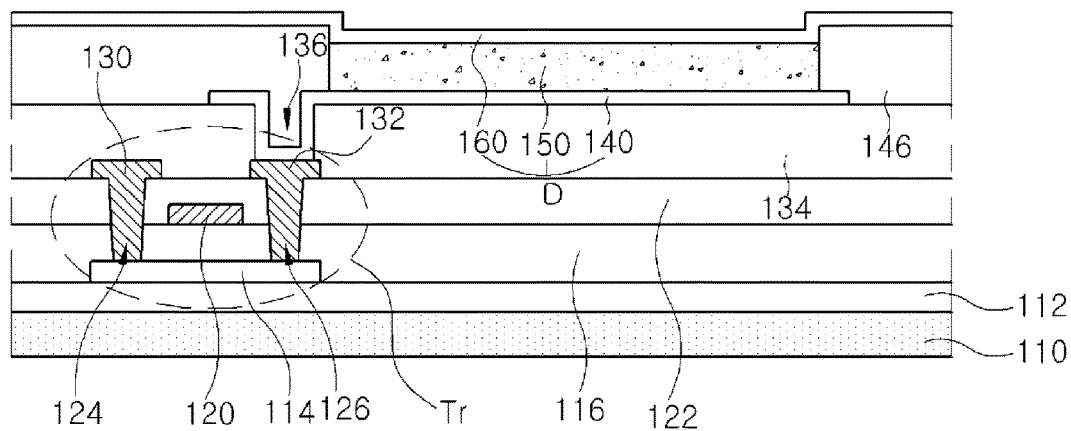
FIG. 2 is one example of a cross-sectional view of an electroluminescent display device according to an embodiment of the present disclosure.

FIG. 2 is a cross-sectional view of an electroluminescent display device according to the embodiment of the present disclosure and shows one pixel region.

As shown in FIG. 2, the electroluminescent display device according to the embodiment of the present disclosure can include a substrate 110, a thin film transistor Tr disposed on the substrate 110, and a light emitting diode D disposed on the substrate 110 and connected to the thin film transistor Tr. In one embodiment, the thin film transistor Tr is the driving transistor Td of FIG. 1. An encapsulation layer (not shown) can be disposed on the light emitting diode D.

The substrate 110 can be a glass substrate or a flexible substrate formed of a polymer such as polyimide.

A buffer layer 112 can be formed on the substrate 110, and the thin film transistor Tr can be formed on the buffer layer 112. The buffer layer 112 can be formed of an inorganic insulating material such as silicon oxide ($SiO_2$) and silicon nitride (SiNx). The buffer layer 112 can be omitted.

A semiconductor layer 114 is formed on the buffer layer 112. The semiconductor layer 114 can be formed of an oxide semiconductor material or polycrystalline silicon. When the semiconductor layer 114 is formed of the oxide semiconductor material, a light-blocking pattern (not shown) can be formed under the semiconductor layer 114. The light-blocking pattern blocks light from being incident on the semiconductor layer 114 to prevent the semiconductor layer 114 from being degraded by the light. Alternatively, the semiconductor layer 114 can be formed of polycrystalline silicon, and in this instance, impurities can be doped in both ends of the semiconductor layer 114.

A gate insulating layer 116 of an insulating material is formed on the semiconductor layer 114. The gate insulating layer 116 can be formed of an inorganic insulating material such as silicon oxide ($SiO_2$) and silicon nitride (SiNx).

A gate electrode 120 of a conductive material such as metal can be formed on the gate insulating layer 116 to correspond to a central portion of the semiconductor layer 114.

In FIG. 2, the gate insulating layer 116 is formed over substantially all of the substrate 110. Alternatively, the gate insulating layer 116 can be patterned to have the same shape as the gate electrode 120.

An interlayer insulating layer 122 of an insulating material is formed on the gate electrode 120. The interlayer insulating layer 122 can be formed over substantially all of the substrate 110. The interlayer insulating layer 122 can be formed of an inorganic insulating material such as silicon oxide ($SiO_2$) and silicon nitride (SiNx) or an organic insulating material such as benzocyclobutene and photo acryl.

The interlayer insulating layer 122 includes first and second contact holes 124 and 126 exposing top surfaces of both sides of the semiconductor layer 114. The first and second contact holes 124 and 126 are spaced apart from the gate electrode 120. The gate electrode 120 can be disposed between the first and second contact holes 124 and 126.

The first and second contact holes 124 and 126 are also formed in the gate insulating layer 116. Alternatively, when the gate insulating layer 116 is patterned to have the same shape as the gate electrode 120, the first and second contact holes 124 and 126 are formed only in the interlayer insulating layer 122.

A source electrode 130 and a drain electrode 132 of a conductive material such as metal are formed on the interlayer insulating layer 122.

The source/drain electrodes 130 and 132 are spaced apart from each other with respect to the gate electrode 120. The source/drain electrodes 130 and 132 contact both sides of the semiconductor layer 114 through the first and second contact holes 124 and 126, respectively.

In the electroluminescent display device, a thin film transistor Tr includes the semiconductor layer 114, the gate electrode 120, the source/drain electrode 130 and the source/drain electrode 132. The thin film transistor Tr functions as a driving element and corresponds to the driving thin film transistor Td of FIG. 1.

The thin film transistor Tr can have a coplanar structure where the gate electrode 120 and the source/drain electrodes 130 and 132 are disposed at one side of the semiconductor layer 114, over the semiconductor layer 114.

Alternatively, the thin film transistor Tr can have an inverted staggered structure where the gate electrode is disposed under the semiconductor layer and the source/drain electrodes are disposed over the semiconductor layer. In this instance, the semiconductor layer can be formed of amorphous silicon.

Although not shown in the figure, a gate line GL and a data line DL as shown in FIG. 1 are also provided within a pixel region, and a switching element, such as transistor Ts is connected to the gate line and the data line. The switching element is also connected to the thin film transistor Tr of the driving element. In some embodiment, the thin film transistor Tr is the driving element and corresponds to the driving transistor Td. The switching element can have the same structure as the thin film transistor Tr.

In addition, a power line corresponding to Vdd can be further formed in parallel to and apart from the gate line or the data line, and a storage capacitor corresponding to Cst can be further formed to constantly maintain a voltage at the gate electrode of the thin film transistor Tr during one frame.

A passivation layer 134 is formed on the source and drain electrodes 130 and 132. The passivation layer 134 can be formed over substantially all of the substrate 110. The passivation layer 134 covers the thin film transistor Tr and has a drain contact hole 136 exposing the drain electrode 132. The passivation layer 134 can be formed of an inorganic insulating material such as silicon oxide (SiO$_2$) and silicon nitride (SiNx) or an organic insulating material such as benzocyclobutene and photo acryl. The passivation layer 134 can have a flat top surface.

In FIG. 2, although the drain contact hole 136 is formed directly over the second contact hole 126, the drain contact hole 136 can be spaced apart from the second contact hole 126.

A first electrode 140 is formed on the passivation layer 134 and is connected to the drain electrode 132 of the thin film transistor Tr through the drain contact hole 136. The first electrode 140 is separately disposed in each pixel region. The first electrode 140 can be an anode and can be formed of a conductive material having a relatively high work function. For example, the first electrode 140 can be formed of a transparent conductive material such as indium tin oxide (ITO) and indium zinc oxide (IZO).

A bank layer 146 is formed on the first electrode 140 and the passivation layer 134. The bank layer 146 covers edges of the first electrode 140. The bank layer 146 exposes a central portion of the first electrode 140 corresponding to the pixel region. The bank layer 146 can be formed of a hydrophobic organic insulating material and have a single-layered structure.

Alternatively, the bank layer 146 can be a double-layered structure including a first bank of a hydrophilic inorganic insulating material and a second bank of a hydrophobic organic insulating material.

A light emitting layer 150 is formed on the first electrode 140 exposed by the bank layer 146. A structure of the light emitting layer 150 will be described in detail later.

A second electrode 160 is formed over the substrate 110 on which the light emitting layer 150 is formed. The second electrode 160 can be formed over substantially all of a display area. The second electrode 160 can be formed of a conductive material having relatively low work function and can serve as a cathode. For example, the second electrode 160 can be, but not limited to this, aluminum (Al), magnesium (Mg), silver (Ag) or their alloy.

The first electrode 140, the light emitting layer 150 and the second electrode 160 constitute a light emitting diode D.

The electroluminescent display device can be a bottom emission type where light emitted from the light emitting layer 150 is outputted to the outside through the first electrode 140.

Alternatively, the electroluminescent display device according to the present disclosure can be a top emission type where light emitted from the light emitting layer 150 is outputted to the outside through the second electrode 160. At this time, the first electrode 140 can further include a reflection electrode or reflection layer under the first electrode 140. For example, the reflection electrode or reflection layer can be formed of aluminum-palladium-copper (APC) alloy. At this time, the second electrode 160 can have a relatively thin thickness such that light is transmitted therethrough.

Figure 3:
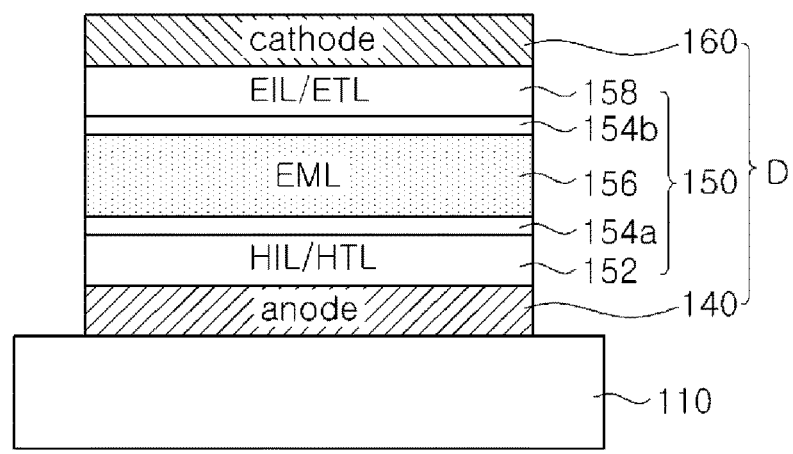
FIG. 3 is a schematic cross-sectional view of an electroluminescent display device according to an embodiment of the present disclosure.
Figure 4:
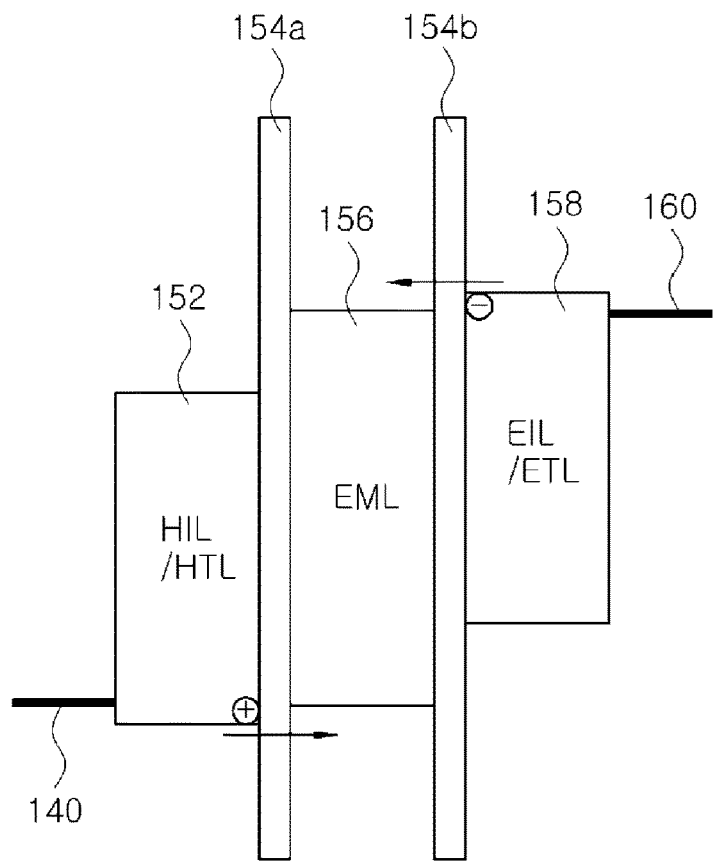
FIG. 4 is a view illustrating an energy band diagram corresponding to a structure of an electroluminescent display device according to an embodiment of the present disclosure.

FIG. 3 is a schematic cross-sectional view of an electroluminescent display device according to the embodiment of the present disclosure, and FIG. 4 is a view illustrating an energy band diagram corresponding to a structure of an electroluminescent display device according to the embodiment of the present disclosure.

In FIGS. 3 and 4, a first electrode 140 is formed in each pixel region on a substrate 110 as an anode.

The first electrode 140 can be formed through a deposition process and can be formed of a conductive material having a relatively high work function. For example, the first electrode 140 can be formed of a transparent conductive material such as indium tin oxide (ITO) and indium zinc oxide (IZO).

In addition, a reflection electrode or a reflection layer can be further formed under the first electrode 140. For example, the reflection electrode or the reflection layer can be formed of aluminum-palladium-copper (APC) alloy.

Meanwhile, the first electrode 140 can include a reflection electrode, and in this case, the first electrode 140 can have a triple-layered structure of ITO/APC/ITO.

A light emitting layer 150 is formed on the first electrode 140. The light emitting layer 150 includes a hole auxiliary layer 152, a first insulation layer 154a, a light emitting material layer 156, a second insulation layer 154b, and an electron auxiliary layer 158. The layers 154a and 154b being electrical insulation layers.

More particularly, the hole auxiliary layer 152 is formed on the first electrode 140. The hole auxiliary layer 152 can include at least one of a hole injecting layer (HIL) and a hole transporting layer (HTL).

The hole auxiliary layer 152 can be formed through a soluble process. A printing method using an injection apparatus including a plurality of nozzles or a coating method can be used for the soluble process. For example, an inkjet printing method can be used for the solution process.

The first insulation layer 154a is formed on the hole auxiliary layer 152, the light emitting material layer (EML) 156 is formed on the first insulation layer 154a, and the second insulation layer 154b is formed on the light emitting material layer 156.

The first and second insulation layers 154a and 154b are formed of the same material, which can be an inorganic material or an organic material. The first and second insulation layers 154a and 154b can be formed through a deposition process. Alternatively the first and second insulation layers 154a and 154b can be formed through a soluble process.

A refractive index of the first and second insulation layers 154a and 154b is smaller than a refractive index of the light emitting material layer 156. Thicknesses of the first and second insulation layers 154a and 154b is 5 nm or less. In one embodiment, the thickness of the second insulation layer 154b can be larger than the thickness of the first insulation layer 154a.

The first and second insulation layers 154a and 154b will be described in detail later.

The light emitting material layer 156 can include one of a red light emitting material, a green light emitting material and a blue light emitting material, and one color can correspond to one pixel region. Alternatively, every pixel region can include the same light emitting material, and in some embodiments, the light emitting material layer 156 can include a blue light emitting material or a white light emitting material layer.

The light emitting material of the light emitting material layer 156 can be an organic light emitting material or an inorganic light emitting material that includes quantum dots.

The light emitting material layer 156 can be formed through a soluble process. Alternatively, the light emitting material layer 156 can be formed through a vacuum thermal evaporation process.

The electron auxiliary layer 158 is formed on the light emitting material layer 156. The electron auxiliary layer 158 can include at least one of an electron transporting layer (ETL) and an electron injecting layer (EIL).

The electron auxiliary layer 158 can be formed through a soluble process. Alternatively, the electron auxiliary layer 158 can be formed through a vacuum thermal evaporation process.

A second electrode 160 is formed on the electron auxiliary layer 158 as a cathode. The second electrode 160 can be formed through a deposition process and can be formed over substantially all of the substrate 110.

The second electrode 160 can be formed of a conductive material having relatively low work function. For example, the second electrode 160 can be formed of aluminum (Al), magnesium (Mg), silver (Ag) or their alloy, but is not limited to this.

Light emitted from the light emitting material layer 156 can be outputted to the outside through the second electrode 160. At this time, the second electrode 160 can have a relatively thin thickness such that the light emitted from the light emitting material 160 passes therethrough.

The first electrode 140, the light emitting layer 150 and the second electrode 160 constitute a light emitting diode D.

As mentioned above, in the present disclosure, the first insulation layer 154a is formed between the hole auxiliary layer 152 and the light emitting material layer 156, and the second insulation layer 154b is formed between the light emitting material layer 156 and the electron auxiliary layer 158.

The refractive index of the first and second insulation layers 154a and 154b is smaller than the refractive index of the light emitting material layer 156. Preferably, a difference between the refractive index of the first and second insulation layers 154a and 154b and the refractive index of the light emitting material layer 156 is 0.4 or more. In one embodiment, the refractive index of the first and second insulation layers 154a and 154b can be 1.3 or less. The first and second insulation layers can be made of either an organic material or an inorganic material. If made of an organic material, then polymer materials having an insulation property and relatively low reflex index, for example, poly(methylmethacrylate), or polydimethyl siloxane or the like can be used. If an inorganic insulator is selected, then aluminum oxide, $Al_2O_3$; Sodium fluoride, NaF; or Lithium Fluoride, LiF, can be used.

The first and second insulation layers 154a and 154b function as optical compensation layers. More particularly, the first and second insulation layers 154a and 154b increase light efficiency by causing light emitted from the light emitting material to be reflected at a boundary with the light emitting material layer 156 and to be outputted.

In addition, the thicknesses of the first and second insulation layers 154a and 154b are 5 nm or less. At this time, holes (+) from the hole auxiliary layer 152 and electrons (−) from the electron auxiliary layer 158 are provided to the light emitting material layer 156 by respectively passing through the first and second insulation layers 154a and 154b due to a tunneling effect, and hole mobility and electron mobility are not affected. Here, if the thicknesses of the first and second insulation layers 154a and 154b are larger than 5 nm, the holes (+) and the electrons (−) do not pass through the first and second insulation layers 154a and 154b and are accumulated in the first and second insulation layers 154a and 154b.

It is possible, in some embodiments to not make use of the respective hole and electron generation layers 152 and 158, respectively, or, alternatively, to incorporate them into the light emitting layers 156.

In one embodiment, it is beneficial that the thicknesses of the first and second insulation layers 154a and 154b are 3 nm or more. If the thicknesses of the first and second insulation layers 154a and 154b are smaller than 3 nm, it is difficult to form a uniform film with current technology. It is desired that films 154a and 154b each of a uniform thickness and uniform optical, electrical and thermal properties throughout. Therefore, it is preferred in one embodiment that the films be over 3 nm in thickness but 5 nm or less in thickness. If a film having uniform optical, electrical, thermal and mechanical properties can be made 2 nm thick or less, this may also be acceptable.

The location of the first insulation layer 154a and the second insulation layer 154b are described relative to the light emitting direction. The layer 154b will always be the layer through which light is emitted and the layer 154a will be the one most adjacent to the light reflecting electrode. Thus, the insulation layer 154a might be on top and the second insulation layer 154b might be on the bottom when it is a bottom emission pixel and the same properties apply as described herein.

Figure 5:
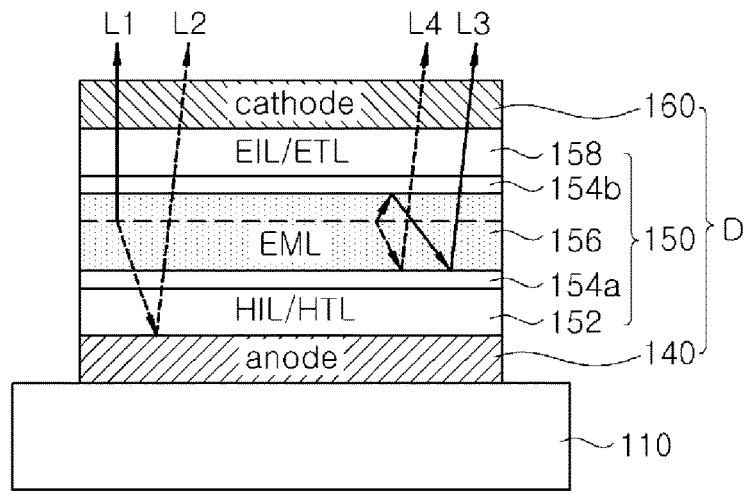
FIG. 5 is a schematic cross-sectional view illustrating light outputted from an electroluminescent display device according to an embodiment of the present disclosure.

FIG. 5 is a schematic cross-sectional view illustrating light outputted from an electroluminescent display device according to the embodiment of the present disclosure, and a top emission type electroluminescent display device will be described as an example.

In FIG. 5, first light L1 emitted from the light emitting material layer 156 toward the second electrode 160 is outputted to the outside through the second electrode 160, and second light L2 emitted from the light emitting material layer 156 toward the first electrode 140 is reflected at the first electrode 140 and then is outputted to the outside through the second electrode 160.

Here, although light is reflected at the first electrode 140 only once in the figure, light can be reflected between the first electrode 140 and the second electrode 160 several times and be outputted.

Next, third light L3 emitted from the light emitting material layer 156 toward the second electrode 160 is reflected at an interface between the light emitting material layer 156 and the second insulation layer 154b due to the difference in the refractive indexes of the light emitting material layer 156 and the second insulation layer 154b. Then the third light L3 is reflected at an interface between the light emitting material layer 156 and the first insulation layer 154a due to the difference in the refractive indexes of the light emitting material layer 156 and the first insulation layer 154a and is outputted to the outside through the second electrode 160.

In addition. fourth light L4 emitted from the light emitting material layer 156 toward the first electrode 140 is reflected at an interface between the light emitting material layer 156 and the first insulation layer 154a due to the difference in the refractive indexes of the light emitting material layer 156 and the first insulation layer 154a and is outputted to the outside through the second electrode 160.

Here, although light is shown reflected at the interfaces between the light emitting material layer 156 and the first and second insulation layers 154a and 154b only once, light can be reflected at the interfaces between the light emitting material layer 156 and the first and second insulation layers 154a and 154b several times.

In the electroluminescent display device according to the embodiment of the present disclosure, the light efficiency can be improved due to a first cavity effect between the first electrode 140 and the second electrode and a second cavity effect between the first and second insulation layers 154a and 154b. Moreover, color purity can be increased, and high color gamut can be obtained.

Figure 6:
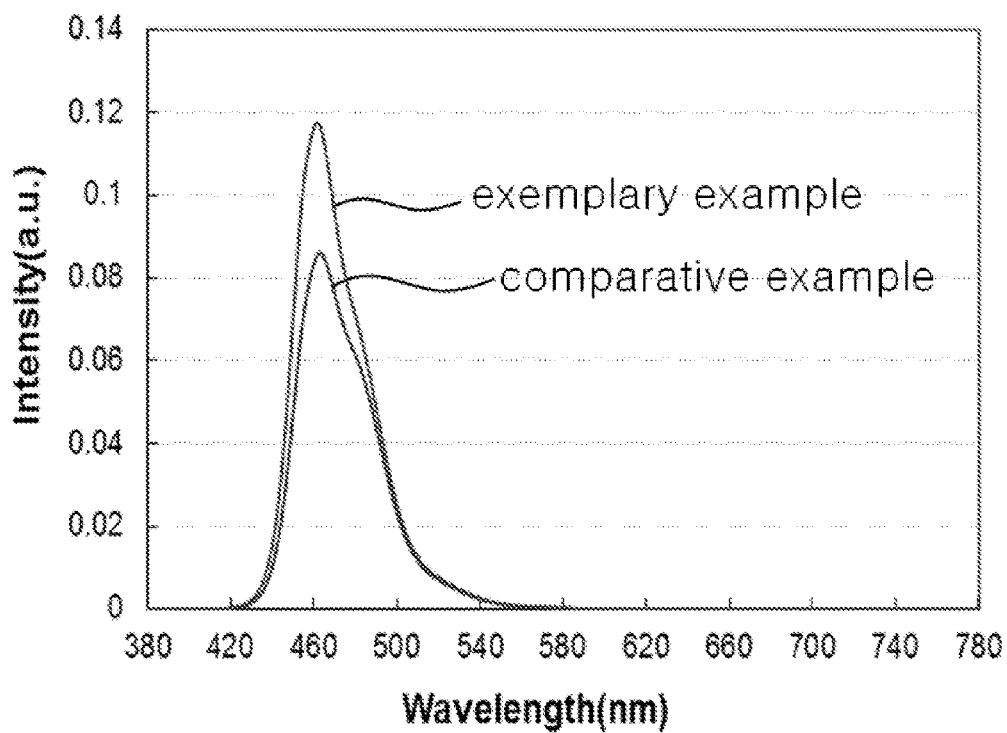
FIG. 6 is a view showing a spectrum of light emitted from an electroluminescent display device of an example embodiment of the present disclosure having next to it a comparative example.
Figure 7:
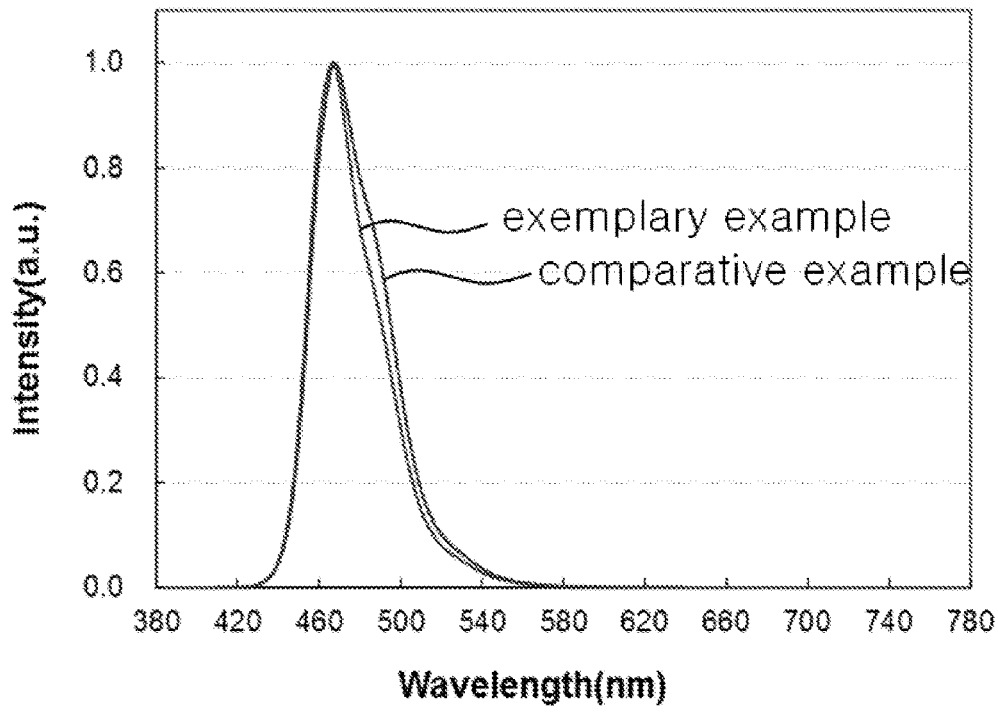
FIG. 7 is a view showing a normalizing spectrum of light emitted from an electroluminescent display device of an example embodiment of the present disclosure having next to it a comparative example.

FIG. 6 is a view showing a spectrum of light emitted from an electroluminescent display device of an exemplary example according to the embodiment of the present disclosure, and FIG. 7 is a view showing a normalizing spectrum of light emitted from an electroluminescent display device of an exemplary example according to the embodiment of the present disclosure. FIGS. 6 and 7 also show a comparative example without first and second insulation layers, and the devices of the exemplary example and the comparative example emit blue light.

In FIG. 6, the electroluminescent display device of the exemplary example according to the embodiment of the present disclosure includes the first and second insulation layers on upper and lower sides of the light emitting material layer, respectively, and the intensity of light emitted therefrom increases as compared with the comparative example without the first and second insulation layers.

Meanwhile, in FIG. 7, the light emitted from the electroluminescent display device of the exemplary example according to the embodiment of the present disclosure is shifted toward short wavelengths and has a narrow width as compared with the comparative example without the first and second insulation layers. Accordingly, in the present disclosure, the color purity of light emitted is increased, and the color gamut is increased.

In the electroluminescent display device, it is desirable that blue CIE y coordinate is 0.1 or less and luminance is 400 $cd/m^2$ or more.

Figure 8A:
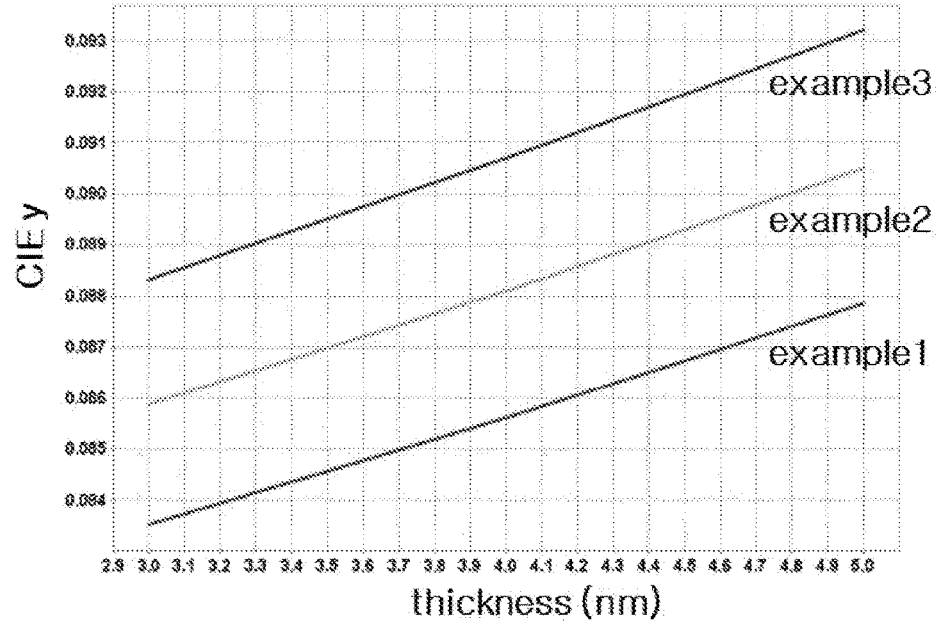
FIGS. 8A and 8B are views showing CIE y coordinate and luminance according to thicknesses of first and second insulation layers in an electroluminescent display device according to an embodiment of the present disclosure.
Figure 8B:
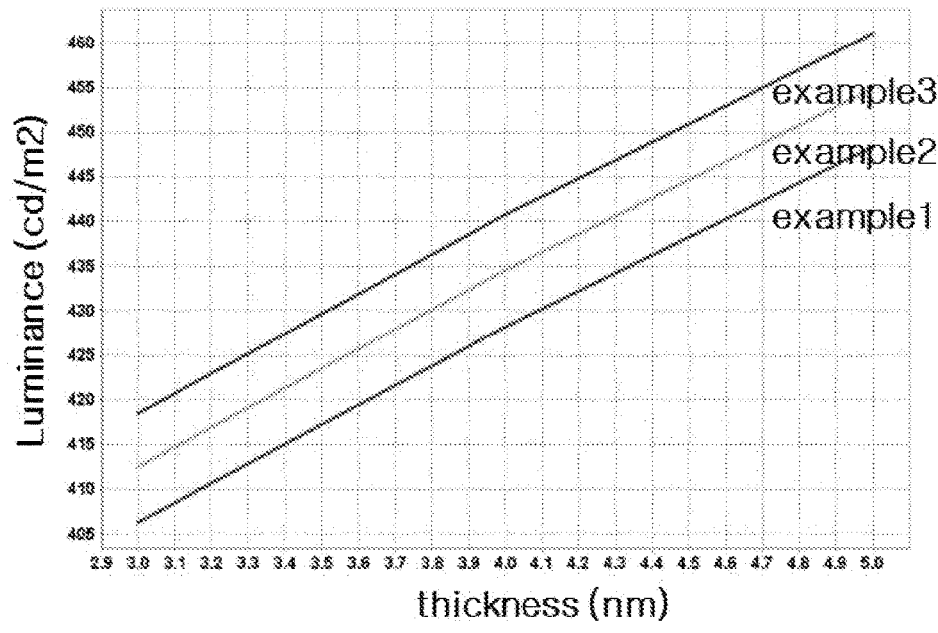

FIGS. 8A and 8B are views showing CIE y coordinate and luminance according to thicknesses of first and second insulation layers in an electroluminescent display device according to the embodiment of the present disclosure, and the CIE y coordinate and the luminance correspond to blue color. Here, a horizontal axis corresponds to the thickness of the first insulation 154a layer, and the second insulation layer 154b has 3 nm, 4 nm and 5 nm in examples 1, 2 and 3, respectively. In addition, the first and second insulation layers have the refractive index of 1.3 and the light emitting material layer has the refractive index of 1.7.

As shown in FIGS. 8A and 8B, in the electroluminescent display device according to the embodiment of the present disclosure, the blue CIE y coordinate is smaller than 0.1 and the luminance is 400 $cd/m^2$ or more.

According to one embodiment, as the thicknesses of the first and second insulation layers increase, the CIE y coordinates increase, and thus the luminance increases. It can be seen that the variation tendency is the same and the variation width is not large.

Figure 9A:
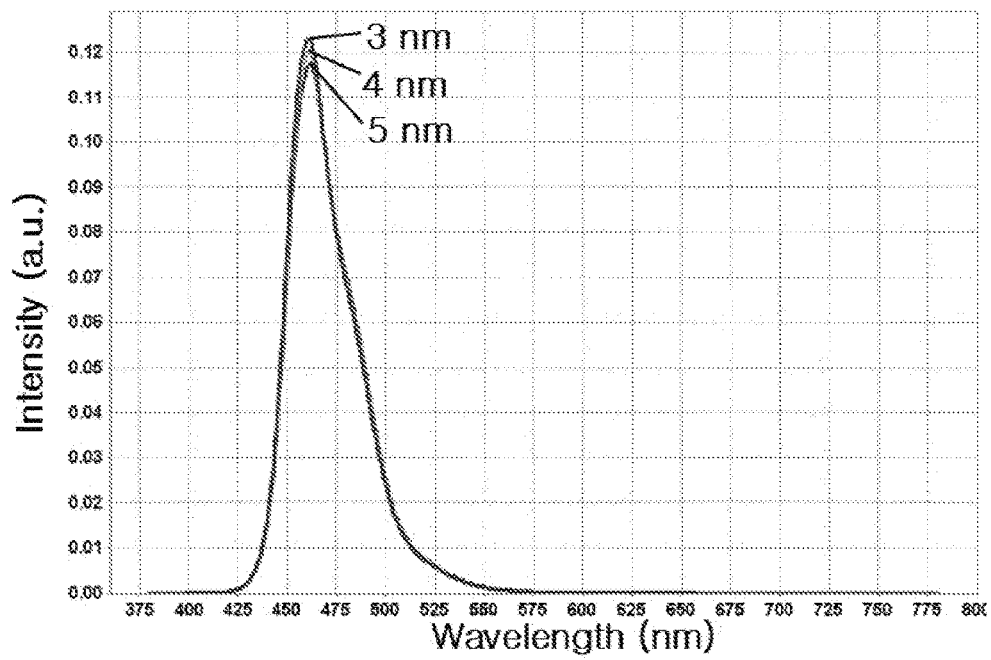
FIG. 9A is a view showing a spectrum of light emitted from an electroluminescent display device according to an embodiment of the present disclosure when a thickness of a first insulation layer is changed.
Figure 9B:
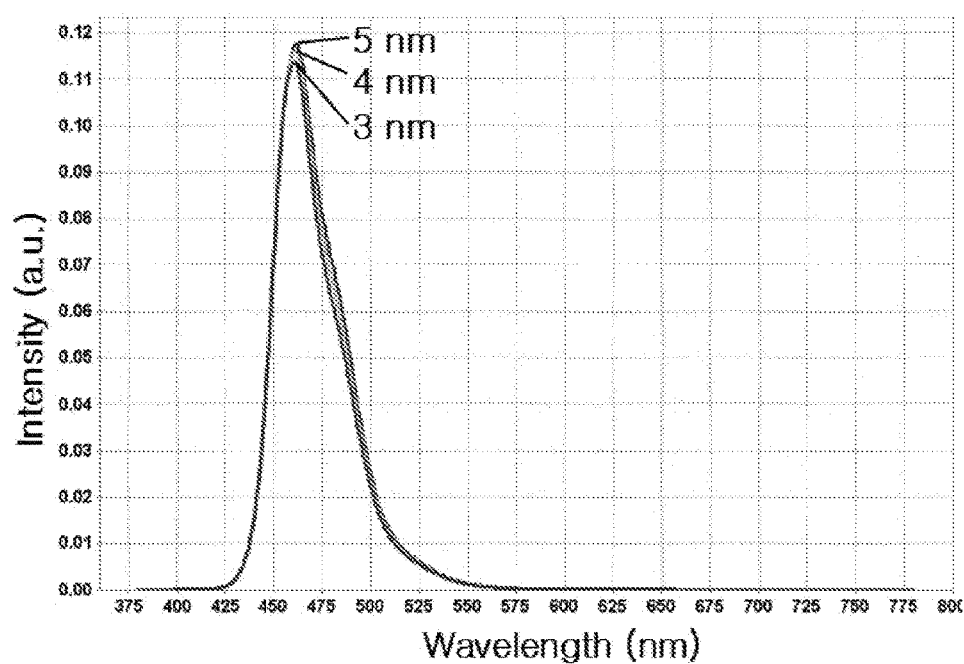
FIG. 9B is a view showing a spectrum of light emitted from an electroluminescent display device according to an embodiment of the present disclosure when a thickness of a second insulation layer is changed

FIG. 9A is a view showing a spectrum of light emitted from an electroluminescent display device according to the embodiment of the present disclosure when a thickness of a first insulation layer 154a is changed. FIG. 9B is a view showing a spectrum of light emitted from an electroluminescent display device according to the embodiment of the present disclosure when a thickness of a second insulation layer 154b is changed.

In FIG. 9A, the thickness of the second insulation layer 154b is 5 nm, and the thickness of the first insulation layer 154a is 3 nm, 4 nm and 5 nm, respectively, with the results as shown. In FIG. 9B, the thickness of the first insulation layer 154a is 5 nm and the thickness of the second insulation layer 154b is 3 nm, 4 nm and 5 nm, respectively, with the results as shown. Moreover, the refractive index of the first and second insulation layers is about 1.3, and the refractive index of the light emitting material layer is 1.7. In one example, the first and second insulation layers can be made of silicon dioxide that has an index of refraction of about 1.4. This is within 0.4 of the 1.7 of the light emitting layer.

In FIG. 9A, as the thickness of the first insulation layer increases, the intensity of light decreases slightly, and in FIG. 9B, as the thickness of the second insulation layer increases, the intensity of light increases slightly.

Accordingly, it is beneficial that the thickness of the second insulation layer is larger than the thickness of the first insulation layer. In one example, the second insulation layer is 50% larger than the first insulation layer. In this case, the first insulation layer 154a is about 3 nm and the second insulation layer exceeds 4.5 nm. In one case, it is about ⅔ larger, namely the second insulation layer is about 66%. This is the case when the first insulation layer is 3 nm or slightly less and the second insulation layer is at 5 nm. Although the top emission type is described as an example in the above embodiment, the present disclosure can be applied to a bottom emission type. At this time, in the bottom emission type, it is preferable that the thickness of the first insulation layer is larger than the thickness of the second insulation layer.

That is, the light efficiency is better when the insulation layer in a direction where light is outputted is thicker than the insulation layer in an opposite direction.

In the present disclosure, the insulation layers having relatively low refractive indexes and thin thicknesses are formed on the upper and lower sides of the light emitting material layer. Thus, the light efficiency can be improved due to the cavity effect between the insulation layers while the hole mobility and the electron mobility are not affected. In addition, the color purity can be increased to realize high color gamut.

Moreover, in the present disclosure, the light efficiency can be further improved by forming the insulation layer on the upper side of the light emitting material layer thicker than the insulation layer on the lower side of the light emitting material layer.

It will be apparent to those skilled in the art that various modifications and variations can be made in a display device of the present disclosure without departing from the sprit or scope of the embodiments. Thus, it is intended that the present disclosure covers the modifications and variations of this invention provided they come within the scope of the appended claims and their equivalents.

The various embodiments described above can be combined to provide further embodiments. All of the U.S. patents, U.S. patent application publications, U.S. patent applications, foreign patents, foreign patent applications and non-patent publications referred to in this specification and/or listed in the Application Data Sheet are incorporated herein by reference, in their entirety. Aspects of the embodiments can be modified, if necessary to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

What is claimed is:

1. An electroluminescent display device, comprising:
    a substrate;
    a first electrode on the substrate;
    a hole injecting layer on the first electrode;
    a hole transporting layer on the hole injecting layer;
    a light emitting material layer on the hole transporting layer;
    an electron transporting layer on the light emitting material layer;
    an electron injecting layer on the electron transporting layer:
    a second electrode on the electron injecting layer; and
    at least one insulation layer between either the hole transporting layer and the light emitting material layer or between the electron transporting layer and the light emitting material layer,
    wherein a refractive index of the at least one insulation layer is smaller by 0.4 or more than a refractive index of the light emitting material layer.

2. The electroluminescent display device of claim 1, wherein the refractive index of the at least one insulation layer is about 1.3 or less.

3. The electroluminescent display device of claim 1, wherein thicknesses of the at least one insulation layer is 5 nm or less.

4. The electroluminescent display device of claim 1, wherein the at least one insulation layer is comprised of inorganic material.

5. The electroluminescent display device of claim 4, wherein the at least one insulation layer includes silicon.

6. The electroluminescent display device of claim 1, wherein the at least one insulation layer is comprised of an organic material.

7. The electroluminescent display device of claim 1, wherein the at least one insulation layer between either the hole transporting layer and the light emitting material layer or between the electron transporting layer and the light emitting material layer is positioned between the hole transporting layer and the light emitting layer.

8. The electroluminescent display device of claim 1, wherein the at least one insulation layer between either the hole transporting layer and the light emitting material layer or between the electron transporting layer and the light emitting material layer is positioned between the electron transporting layer and the light emitting layer.

9. The electroluminescent display device of claim 8, further including a second insulation layer positioned between the layer between the hole transporting layer and the light emitting material layer.

10. The electroluminescent display device of claim 9, wherein the insulation layer in a direction where light emitted from the light emitting material layer is outputted is thicker than the insulation layer in an opposite direction.

11. The electroluminescent display device of claim 10, wherein the insulation layer between the electron transporting layer and the light emitting material layer is thicker than the insulation layer between the hole transporting layer and the light emitting material layer.

12. The electroluminescent display device of claim 10, wherein the insulation layer in a direction where light emitted from the light emitting material layer is outputted is about 50% thicker than the insulation layer in an opposite direction.

13. The electroluminescent display device of claim 10, wherein the insulation layer in a direction where light emitted from the light emitting material layer is outputted is over 60% thicker than the insulation layer in an opposite direction.

14. An electroluminescent display device, comprising:
    a substrate;
    a first electrode on the substrate;
    a hole injecting layer on the first electrode;
    a hole transporting layer on the hole injecting layer:
    a light emitting material layer on the hole transporting layer;
    an electron transporting layer on the light emitting material layer;
    an electron injecting layer on the electron transporting layer:
    a second electrode on the electron injecting layer;
    a first insulation layer between the hole transporting layer and the light emitting material layer; and
    a second insulation layer between the electron transporting layer and the light emitting material layer, wherein a refractive index of each of the insulation layers is smaller by 0.4 or more than a refractive index of the light emitting material layer.

15. The electroluminescent display device of claim 14, wherein the refractive index of the insulation layers is 1.4 or less.

16. The electroluminescent display device of claim 14, wherein thicknesses of first insulation layer is less than 4 nm and the thickness of the second insulation layer is at least 50% greater than the thickness of the first insulation layer.

17. The electroluminescent display device of claim 14, wherein thicknesses of first insulation layer is 3 nm or less and the thickness of the second insulation layer is at least 60% greater than the thickness of the first insulation layer.

18. An electroluminescent display device, comprising:
a substrate;
a first electrode on the substrate;
a hole transporting layer on the first electrode;
a light emitting material layer overlying the first electrode;
a second electrode overlying the light emitting material layer;
a first insulation layer between the hole transporting layer and the light emitting material layer;
a second insulation layer between the light emitting material layer and the second electrode,
wherein a refractive index of each of the first and second insulation layers is smaller bar 0.4 or more than a refractive index of the light emitting material layer.

19. The electroluminescent display device of claim 18, wherein a thicknesses of first insulation layer is less than 4 nm and a thickness of the second insulation layer is at least 50% greater than the thickness of the first insulation layer.

20. The electroluminescent display device of claim 19, wherein the thicknesses of first insulation layer is 3 nm or less and the thickness of the second insulation layer is at least 60% greater than the thickness of the first insulation layer.

21. An electroluminescent display device, comprising:
a substrate;
a first electrode on the substrate;
a light emitting material layer overlying the first electrode;
an electron transporting layer on the light emitting material layer;
a second electrode overlying the electron transporting layer;
a first insulation layer between the first electrode and the light emitting material layer;
and a second insulation layer between the light emitting material layer and the electron transporting layer,
wherein a refractive index of the second insulation layer is smaller by 0.4 or more than the refractive index of the light emitting material layer, and
wherein light that is emitted from the light emitting layer is reflected at boundaries of the first insulating layer and the second insulating layer.

22. The electroluminescent display device of claim 21, wherein a refractive index of each of the first and second insulation layers is smaller than a refractive index of the light emitting material layer.

* * * * *

UNITED STATES PATENT AND TRADEMARK OFFICE
CERTIFICATE OF CORRECTION

PATENT NO. : 10,333,107 B2  
APPLICATION NO. : 15/847725  
DATED : June 25, 2019  
INVENTOR(S) : Hak-Min Lee et al.

Page 1 of 1

It is certified that error appears in the above-identified patent and that said Letters Patent is hereby corrected as shown below:

In the Claims

Column 13, Claim 18, Line 28:
"smaller bar 0.4" should be -- smaller by 0.4 --.

Signed and Sealed this
Eighteenth Day of February, 2020

Andrei Iancu
*Director of the United States Patent and Trademark Office*

UNITED STATES PATENT AND TRADEMARK OFFICE
CERTIFICATE OF CORRECTION

| | |
|---|---|
| PATENT NO. | : 10,333,107 B2 |
| APPLICATION NO. | : 15/847725 |
| DATED | : June 25, 2019 |
| INVENTOR(S) | : Lee et al. |

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 12 days.

Signed and Sealed this
Seventeenth Day of March, 2020

Andrei Iancu
*Director of the United States Patent and Trademark Office*